(12) United States Patent
Kiyohara et al.

(10) Patent No.: US 7,986,194 B2
(45) Date of Patent: Jul. 26, 2011

(54) OSCILLATOR

(75) Inventors: Atsushi Kiyohara, Chigasaki (JP); Takehiro Yamamoto, Machida (JP)

(73) Assignee: Epson Toyocom Corporation (JP)

( * ) Notice: Subject to any disclaimer, the term of this patent is extended or adjusted under 35 U.S.C. 154(b) by 236 days.

(21) Appl. No.: 12/021,541

(22) Filed: Jan. 29, 2008

(65) Prior Publication Data

US 2008/0180183 A1    Jul. 31, 2008

(30) Foreign Application Priority Data

Jan. 30, 2007   (JP) ................................. 2007-018853
Dec. 20, 2007   (JP) ................................. 2007-328372

(51) Int. Cl.
*H03B 5/32* (2006.01)
(52) U.S. Cl. .............. 331/158; 331/116 R; 331/116 FE; 331/177 V; 331/185; 331/186
(58) Field of Classification Search .......... 331/116 R, 331/116 FE, 158, 177 V, 185, 186
See application file for complete search history.

(56) References Cited

U.S. PATENT DOCUMENTS

| | | | | |
|---|---|---|---|---|
| 4,139,826 A | * | 2/1979 | Pradal | 331/116 R |
| 4,470,024 A | * | 9/1984 | Leuenberger | 331/108 D |
| 4,827,226 A | * | 5/1989 | Connell | 331/116 FE |
| 6,172,576 B1 | * | 1/2001 | Endo et al. | 331/116 R |
| 6,507,248 B2 | * | 1/2003 | Nakamura | 331/158 |
| 6,710,669 B2 | * | 3/2004 | Hasegawa et al. | 331/177 V |
| 6,734,747 B1 | * | 5/2004 | Ishikawa et al. | 331/158 |
| 6,933,797 B2 | * | 8/2005 | Miyahara et al. | 331/186 |
| 7,348,861 B1 | * | 3/2008 | Wu et al. | 331/158 |
| 2001/0052826 A1 | * | 12/2001 | Kubo et al. | 331/116 R |

FOREIGN PATENT DOCUMENTS

| | | |
|---|---|---|
| JP | 03-068203 | 3/1991 |
| JP | 07-273547 | 10/1995 |
| JP | 2004-343733 | 12/2004 |

* cited by examiner

*Primary Examiner* — Arnold Kinkead
*Assistant Examiner* — Richard Tan
(74) *Attorney, Agent, or Firm* — Harness, Dickey & Pierce, P.L.C.

(57) ABSTRACT

An oscillator, includes an amplifier circuit including a semiconductor element having a first constant potential as reference potential for a power supply voltage, a variable capacitance element, a piezoelectric resonator, and a capacitance circuit constituting a closed circuit with the piezoelectric resonator. The amplifier circuit and the variable capacitance element are connected in series to provide a series circuit. The capacitance circuit connects the capacitance elements in a plurality of numbers in series. A connecting midpoint of the series connection is connected to a circuit for the first constant potential. Two connecting midpoints other than the midpoint of the closed circuit are used as connecting points to connect the series circuit and the closed circuit in parallel.

6 Claims, 7 Drawing Sheets

OSCILLATOR

BACKGROUND OF THE INVENTION

1. Technical Field

The present invention relates to an oscillator. In particular, the present invention relates to a circuit technique allowing variable range of oscillating frequency to be widely adjustable by using control voltage.

2. Related Art

Previously, there has been proposed an oscillator utilizing an inverter amplifier circuit so as to contribute to miniaturization of devices.

Such oscillator is usually configured such that the oscillation of a piezoelectric resonator is amplified in a feedback loop. However, the oscillating frequency of the piezoelectric resonator is determined depending on capacitance of a capacitance element within an oscillating loop and therefore fixed. In view of this, there has been developed a VCO (voltage-controlled oscillator) as shown in FIG. 10.

FIG. 10 is a circuit diagram of an inverter oscillator of related art disclosed in JP-7-273547. The inverter oscillator includes basically an inverter amplifier circuit 31 having an inverter 34 and a feedback resistance 35, an oscillating element 32 and a voltage control portion 33.

Further, a capacitance element 38 for blocking direct current is connected to an input side of the inverter 34 in series. A voltage variable capacitance element 39 is connected between one terminal A at a side adjacent to the capacitance element 38 of the series circuit and a circuit for grounding. The one terminal (midpoint) A and a terminal B used for applying a control voltage are connected with a resistance 40 interposed therebetween. Moreover, the oscillating element 32 is connected to a series circuit of the inverter circuit 34 and the capacitance element 38 in parallel. A capacitance element 37 is connected between an output side of the inverter circuit 34 and the circuit for grounding.

According to such configuration, the closed circuit including the oscillating element 32, the capacitance element 37, and the voltage-controlled variable capacitance element 39 functions as an oscillating loop. By making capacitance of the voltage variable capacitance element 39 variable by applying a control voltage from the terminal B, the oscillating frequency can be adjusted.

Furthermore, JP-3-68203 discloses a voltage-controlled oscillator having variable capacitance portions at both of input and output sides of an oscillating amplifier circuit.

The related arts disclosed in JP-7-273547 and JP-3-68203 have common in that the variable capacitance element 39 is provided solely within the oscillating loop.

According to such configuration, capacitance variable range of the variable capacitance element 39 must be widened so as to set frequency change amount with respect to capacitance change amount of the variable capacitance element 39 as large as possible.

However, the extension of capacitance variable range of the variable capacitance element 39 is limited.

In particular, in the case in which the portions in the oscillator other than a piezoelectric resonator are made to be an integrated circuit (IC chip), the fabrication process of the IC chip must be drastically revised in order to make capacitance variable range of the variable capacitance element 39 optimal, which is, however, not realistic in actuality in the terms of development time and cost.

Further, even when the fabrication process of the IC chip is revised and optimal design is performed at simulation, adverse effects of parasitic capacitance occurring in parallel to the variable capacitance element 39 are large in the actual circuit, so there was a problem in that desired frequency change amount and frequency control function cannot be obtained.

SUMMARY

An advantage of the present invention is to provide an inverter oscillator capable of easily controlling variable amount of oscillating frequency and having widened variable range of oscillating frequency.

An oscillator according to one aspect of the invention includes: an amplifier circuit including a semiconductor element having a first constant potential as a reference potential for a power supply voltage; a variable capacitance element; a piezoelectric resonator; and a capacitance circuit constituting a closed circuit with the piezoelectric resonator. The amplifier circuit and the variable capacitance element are connected in series to provide a series circuit. The capacitance circuit connects a plurality of capacitance elements in series. A connecting midpoint of the series connection is connected to a circuit for the first constant potential. Two connecting midpoints other than the connecting midpoint of the closed circuit are used as connecting points to connect the series circuit and the closed circuit in parallel.

According to the invention, the variable capacitance element is connected to the amplifier circuit in series and the oscillating loop portion is connected to the series circuit in parallel, thereby making it possible to allow parasitic capacitance to function as a bypass capacitor for the variable capacitance element and further to change frequency largely.

In this case, the variable capacitance element may be a voltage-controlled variable capacitance element, and a resistance for blocking of an alternating current may be connected between one voltage input terminal of the variable capacitance element and one connecting point, which is one of the two connecting points, to the closed circuit.

According to the invention, the variable capacitance element is connected to the amplifier circuit in series and the oscillating loop portion is connected to the series circuit in parallel, thereby making it possible to utilize parasitic capacitance positively, so that frequency can be changed with small change of control voltage.

In this case, the capacitance circuit may include a capacitance element constituted by a variable capacitance element.

According to the invention, the variable capacitance element is connected to the amplifier circuit in series and the oscillating loop portion is connected to the series circuit in parallel, thereby making it possible to allow parasitic capacitance to function as a bypass capacitor for the variable capacitance element and further to change frequency largely.

In this case, the circuit for the first constant potential may be a circuit for grounding, and the amplifier circuit may be an inverter amplifier circuit of a single power supply type including an earth terminal.

According to the invention, the variable capacitance element is connected to the amplifier circuit in series and the oscillating loop portion is connected to the series circuit in parallel, thereby making it possible to allow parasitic capacitance to function as a bypass capacitor for the variable capacitance element and further to change frequency largely.

In this case, the amplifier circuit may be an NPN type transistor, and an emitter of the transistor may be connected to a circuit for grounding According to the invention, the variable capacitance element is connected to the amplifier circuit in series and the oscillating loop portion is connected to the series circuit in parallel, thereby making it possible to allow parasitic capacitance to function as a bypass capacitor for the variable capacitance element and further to change frequency largely and to achieve an oscillator having excellent noise properties.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in details with reference to embodiments shown in drawings. It should be noted that components, variations, combinations, forms and relative arrangements in connection with those embodiments of the invention do not restrict the invention thereto, but are merely shown as examples unless otherwise noted.

Figure 1B:
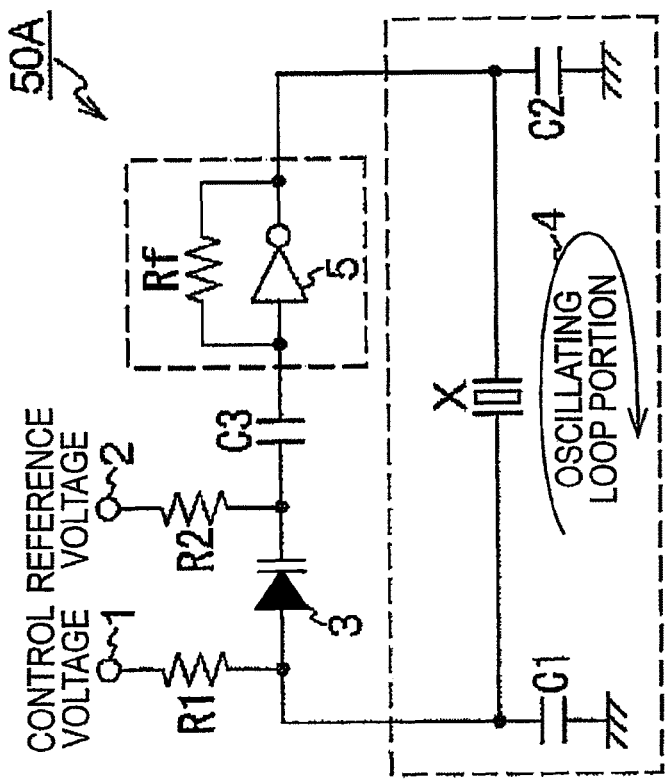
FIG. 1B is a view of circuit configuration of the inverter circuit according to the first embodiment of the invention.
Figure 1A:
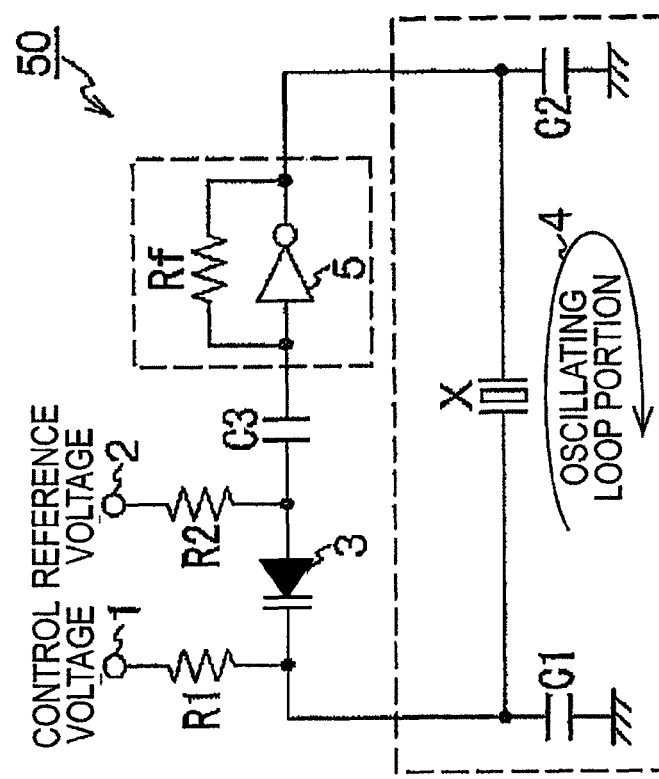
FIG. 1A is a view of circuit configuration of an inverter circuit according to a first embodiment of the invention.

FIG. 1A and FIG. 1B each shows a view of circuit configuration of an oscillator according to a first embodiment of the invention. An oscillator 50 according to the invention includes an amplifier circuit constituted by a semiconductor element using a ground potential as a first constant potential for a reference potential of power supply voltage, a quartz crystal resonator (piezoelectric resonator) X, a capacitance circuit constituting a closed circuit with the quartz crystal resonator, and a voltage-controlled variable capacitance element (varactor).

Further, the amplifier circuit is, for example, a single power supply type circuit and constituted as an inverter amplifier circuit, that includes: an inverter circuit 5 having a power supply terminal and, besides an input and output terminals, an earth terminal used for establishing connection to a circuit for grounding (circuit for the first constant potential); and a feedback resistance Rf.

The inverter amplifier circuit and the varactor constitute through the intermediation of a capacitance element C3 for blocking of direct current a first series circuit.

Herein, the first series circuit is connected to the quartz crystal resonator X in parallel.

The capacitance circuit is a series circuit, in which terminals at one side of a capacitance element C1 and a capacitance element C2 are each used as a connecting point to the circuit for grounding (circuit for the first constant potential).

There is provided a closed circuit, which is constituted by connecting the capacitance circuit and the quartz crystal resonator X in parallel.

Further, a voltage input terminal 1 and a voltage input terminal (reference voltage input terminal) 2 are both terminals, to which control voltage for control of capacitance value of the varactor 3 is applied.

The voltage input terminal 1 is connected to one terminal of the varactor 3 via a resistance R1 for blocking of alternating current. The reference voltage input terminal 2 is connected to the other terminal of the varactor 3 via a resistance R2 for blocking of alternating current.

As shown in FIG. 1A, the oscillator 50 is constructed such that an anode of the variable capacitance element 3 is connected to an input terminal of the inverter circuit 5. Meanwhile, the oscillator 50A shown in FIG. 1B is constructed such that a cathode of the variable capacitance element 3 is connected to the input terminal of the inverter circuit 5.

In those circuits described above, a closed circuit constituted by the quartz crystal resonator X, the capacitance element C1, the capacitance element C2 and the circuit for grounding is used as an oscillating loop portion (resonance circuit portion) 4, on which the state of oscillating of an oscillating circuit mainly depends.

Note that according to the embodiment of the invention, a variable capacitance diode of bipolar type is used as a voltage changeable capacitance element. However, it should not be construed restrictively; other elements such as MOS-type variable capacitance element may be used.

A MOS-type variable capacitance element has such a feature that it has larger amount of capacitance change with respect to voltage change than a variable capacitance diode of bipolar type.

As a result, the configuration of the oscillating circuit according to the invention is suitable for taking advantage of excellent properties described above of a MOS-type variable capacitance element to achieve an oscillator, in which the frequency variable range is wide.

In the oscillator 50 having such the configuration, since there is parasitic capacitance between the input terminal of the inverter circuit 5 and the circuit for grounding, the anode of the variable capacitance element 3 is connected to the circuit for grounding through the intermediation of the parasitic capacitance and the capacitance element C3.

That is to say, according to this embodiment of the invention, a variable capacitance element is inserted and connected between at least one of the input terminal and the output terminal of the amplifier circuit and circuit wiring constituting the oscillating loop portion (except the circuit for grounding).

According to such the construction, there is not provided a capacitance element for the purpose of bypass only between the terminal of the varactor 3 to be connected to the amplifier circuit and the circuit for grounding, but parasitic capacitance (for example, one generating between an input terminal of an inverter circuit or transistor and an earth), which has been negatively regarded as hindrance because it intervenes increase in frequency change amount within the amplifier circuit as a semiconductor element (semiconductor part), is now positively used as a capacitance element for the purpose of bypass so as to establish AC-connection of the varactor 3 and the circuit for grounding. As a result, the control of the frequency variable amount can be advantageously performed and, what is more, the miniaturization of the oscillator can be also facilitated, as compared with the configuration in which a series circuit constituted by a varactor and a fixed capacitance element is simply connected to the capacitance element C1.

Furthermore, it is also possible to apply the present invention to an oscillator, in which a circuit constituting oscillating elements except the quartz crystal resonator X is made up of one single IC chip. In this case, since more floating capacitance is generated within the IC chip, it becomes possible to connect the varactor 3 with much larger floating capacitance to the circuit for grounding. Accordingly, it becomes possible to allow the varactor 3 to function more effectively.

Figure 2A:
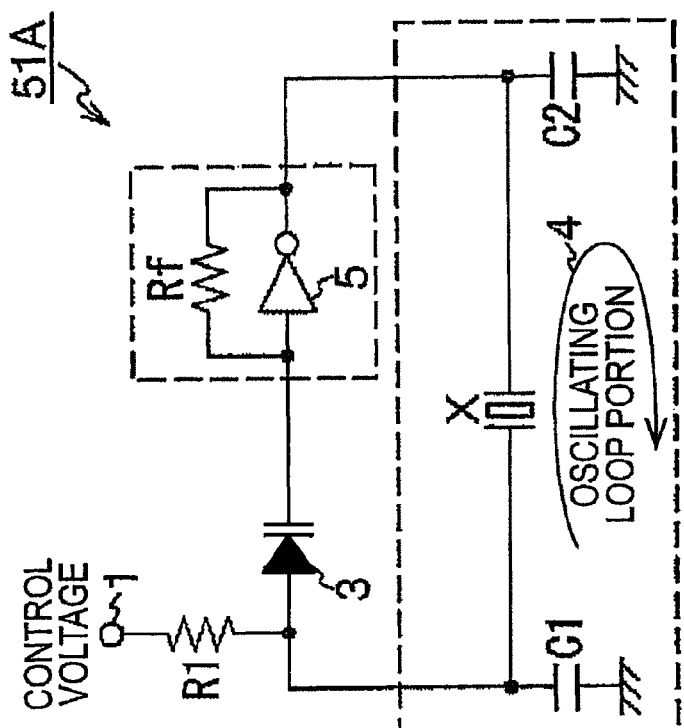
FIG. 2A is a view of circuit configuration of an inverter circuit according to a second embodiment of the invention.
Figure 2B:
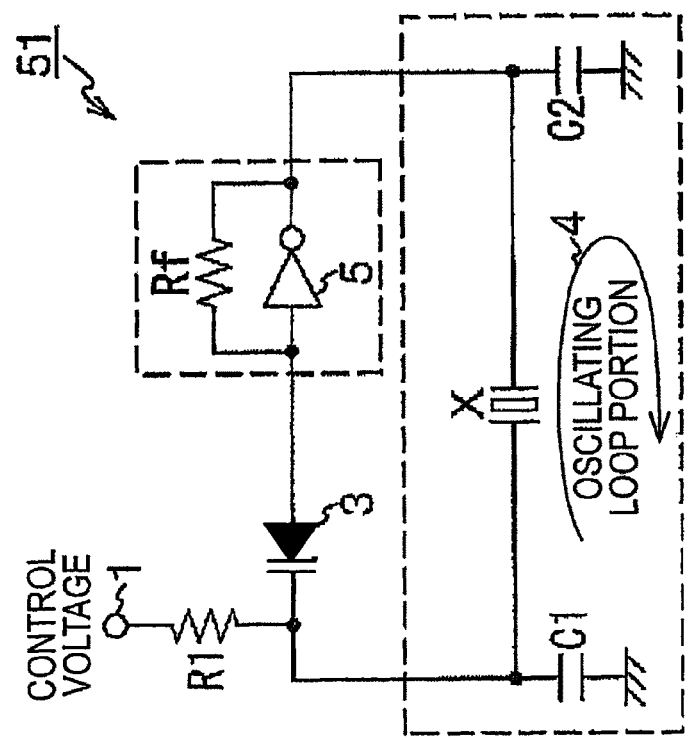
FIG. 2B is a view of circuit configuration of the inverter circuit according to the second embodiment of the invention.

FIG. 2A and FIG. 2B each show a view of circuit configuration of an inverter oscillator according to a second embodiment of the invention. In the following description, the components similar to those of the embodiment shown in FIG. 1A and FIG. 1B have the same reference symbols as the embodiment shown in FIG. 1A and FIG. 1B. In the inverter oscillator here, the capacitance element C3 for blocking of direct current shown in FIG. 1A and FIG. 1B is omitted, a capacitance circuit of the oscillating loop portion 4 is connected to a series circuit in parallel, in which one terminal of the varactor 3 is connected to the input side of the inverter circuit 5, and bias voltage at the input side or at the output side of the inverter circuit 5 is used as reference voltage to be applied to the varactor 3.

In other words, according to this embodiment of the invention shown in FIG. 2A, as compared with a circuit diagram of FIG. 1A, the capacitance element C3 for blocking of direct current is omitted and the anode of the vector 3 is connected to the input side (input side of the amplifier circuit) of the inverter circuit 5. Therefore, reference voltage of the varactor 3 is bias voltage generated due to the feedback resistance Rf feed backed to the input of the inverter circuit 5, so the capacitance element 3 and a circuit used for applying reference voltage can become dispensable, thereby making it possible to further simplify circuit configuration.

The inverter oscillator 51A shown in FIG. 2B is constructed such that the varactor 3 is inverted.

Figure 3B:
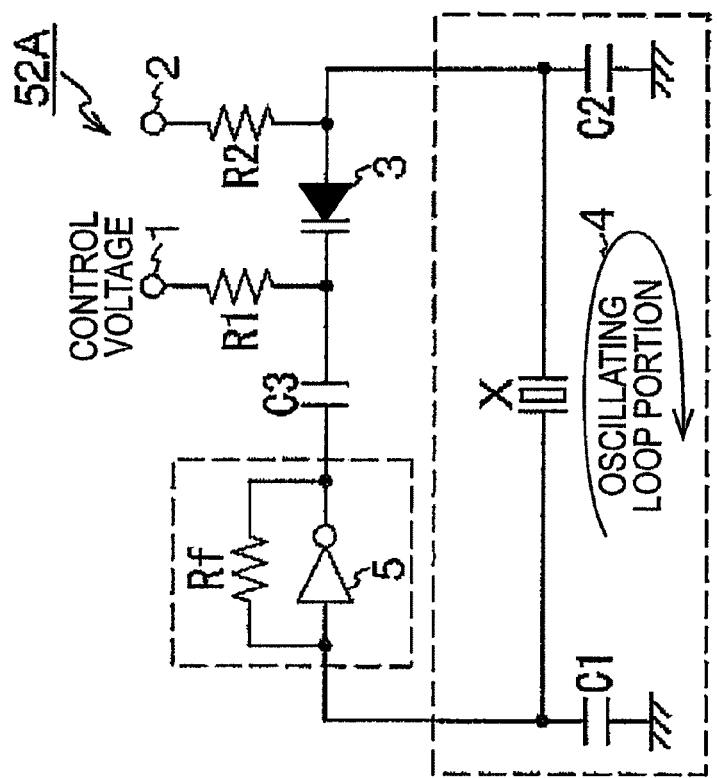
FIG. 3B is a view of circuit configuration of the inverter circuit according to the third embodiment of the invention.
Figure 3A:
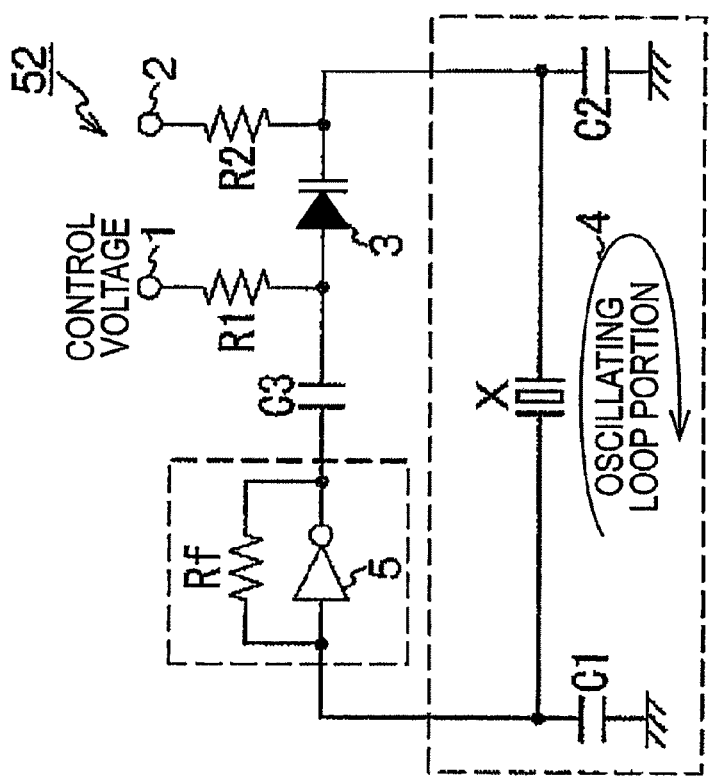
FIG. 3A is a view of circuit configuration of an inverter circuit according to a third embodiment of the invention.

FIG. 3A and FIG. 3B each show a view of circuit configuration of an inverter oscillator according to the third embodiment of the invention. In the following description, the components similar to those of the embodiment shown in FIG. 1A and FIG. 1B have the same reference symbols as the embodiment shown in FIG. 1A and FIG. 1B. The oscillator 52 here includes an amplifier circuit having a feedback resistance Rf and an inverter circuit 5, a quartz crystal resonator X connected between an input terminal and an output terminal of the inverter circuit 5, and an oscillating loop portion 4 including the quartz crystal resonator X.

Further, there are also provided the capacitance element C3 for blocking of direct current connected to the output side of the inverter circuit 5 and a varactor 3 connected to the capacitance element C3 for blocking of direct current in series.

Furthermore, the oscillator 52 has such a construction that a series circuit between the input side of the inverter circuit 5 and one terminal of the varactor 3 is connected to a capacitance circuit constituting the oscillating loop portion 4 in parallel.

With the oscillator 52 having such the configuration, it becomes possible to make oscillating frequency of the oscillator 52 variable by changing potential difference between the terminals of the varactor 3 to change the capacitance of the varactor 3.

According to this embodiment of the invention shown in FIG. 3A, the capacitance element for blocking of direct current is connected to the output side of the inverter circuit 5 including the feedback resistance Rf while no effect is imparted on output bias voltage of the inverter circuit 5, an anode of the varactor 3 is connected to the other terminal of the capacitance element C3 in series, and a cathode of the varactor 3 is connected to the oscillating loop portion 4 in parallel.

The connecting point between the capacitance element C3 and the output terminal of the amplifier circuit is connected to the earth through the intermediation of parasitic capacitance existing in the output terminal of the inverter circuit 5 as a semiconductor circuit and the earth. Therefore, it becomes possible to change oscillating frequency of the oscillator 50 by changing capacitance of the varactor 3 by changing potential difference between the terminals of the varactor 3 because parallel capacitance of the capacitance element C2 changes.

With such the configuration, the oscillating frequency changes upon change of capacitance by applying potential difference to the both terminals of the varactor 3. As a result, it becomes possible to allow parasitic capacitance to function as a bypass capacitor for a variable capacitance element, thereby making it possible to make frequency change only with small change of control voltage.

The inverter oscillator 52A shown in FIG. 3B is constructed such that the varactor 3 is inverted.

Figure 4B:
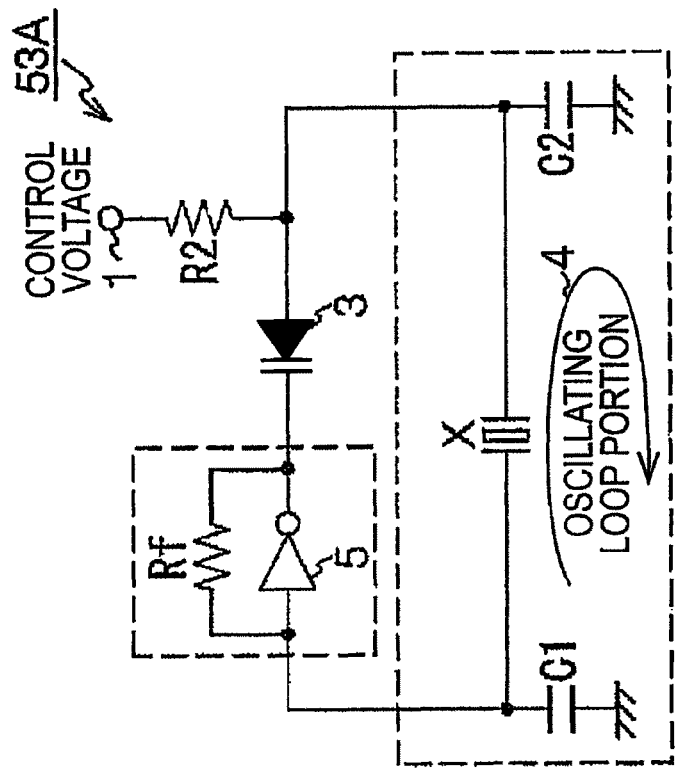
FIG. 4B is a view of circuit configuration of the inverter circuit according to the fourth embodiment of the invention.
Figure 4A:
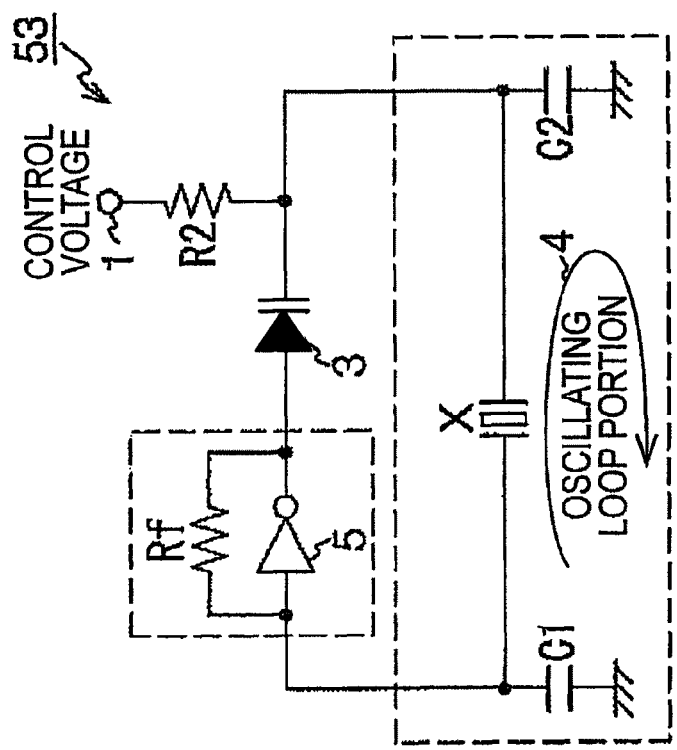
FIG. 4A is a view of circuit configuration of an inverter circuit according to a fourth embodiment of the invention.

FIG. 4A and FIG. 4B each show a view of circuit configuration of an inverter oscillator according to a fourth embodiment of the invention. In the following description, the components similar to those of the embodiment shown in FIG. 1A and FIG. 1B have the same reference symbols as the embodiment shown in FIG. 1A and FIG. 1B.

In the inverter oscillator 53, the capacitance element C3 for blocking of direct current shown in FIG. 3A and FIG. 3B is omitted, one terminal of the varactor 3 and the output side of the inverter circuit 5 are connected, the input side of the inverter circuit 5 and the other terminal of the varactor 3 is connected to a capacitance circuit constituting the oscillating loop portion 4 in parallel, and bias voltage of the output side of the inverter circuit 5 is used as reference voltage of the varactor 3.

Therefore, the reference voltage of the varactor 3 uses bias voltage generated from the output side of the inverter circuit 5. As a result, the capacitance element C3 and the circuit used for applying reference voltage are not needed, thereby making it possible to further simplify circuit configuration.

The inverter oscillator 53A shown in FIG. 4B is constructed such that the varactor 3 is inverted.

Figure 5:
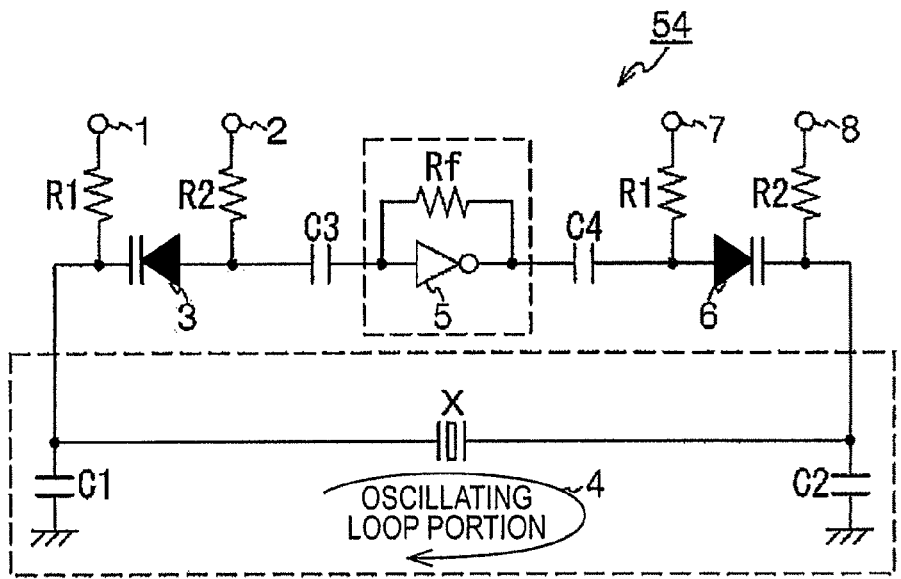
FIG. 5 is a view of circuit configuration of an inverter circuit according to a fifth embodiment of the invention.

FIG. 5 shows a view of circuit configuration of an inverter oscillator according to a fifth embodiment of the invention. In the following description, the components similar to those of the embodiment shown in FIG. 1A and FIG. 1B have the same reference symbols as the embodiment shown in FIG. 1A and FIG. 1B. This inverter oscillator 54 includes an amplifier circuit having a feedback resistance Rf and the inverter circuit 5, quartz crystal resonator X connected between the input terminal and the output terminal of the inverter circuit 5, and an oscillating loop portion 4 including the quartz crystal resonator X.

Further, one terminal of the capacitance element C3 for blocking of direct current is connected to the input terminal of the inverter circuit 5, the capacitance element C4 for blocking of direct current it connected to the output terminal of the inverter circuit 5, and one terminal of the varactor 3 is connected to the other terminal of the capacitance element C3 for blocking of each direct current.

The inverter oscillator 54 further includes a series circuit, in which the other terminal of the capacitance element C4 is connected to a varactor 6. The series circuit is connected to a capacitance circuit constituting the oscillating loop portion 4 in parallel.

With such the oscillator 54, it becomes possible to make oscillating frequency of the inverter oscillator 54 variable by imparting potential difference to the both terminals of each varactor 3, 6 so that capacitance of each varactor 3, 6 becomes variable.

Although not shown, the polarities of the varactors 3, 6 may be opposite. It is also possible to omit the capacitance elements C3, C4 for blocking of direct current, a terminal 2 and a terminal 7, use bias voltage at the input and output sides of the amplifier circuit as reference voltage, and input control voltage as variable voltage into a terminal 1 and a terminal 8.

In other words, according to this embodiment of the invention, a plurality of the varactors 3, 6 are connected to each other in series and to the oscillating loop portion 4 in parallel, so variable range of frequency can be widened and complicated control can be carried out.

Figure 6:
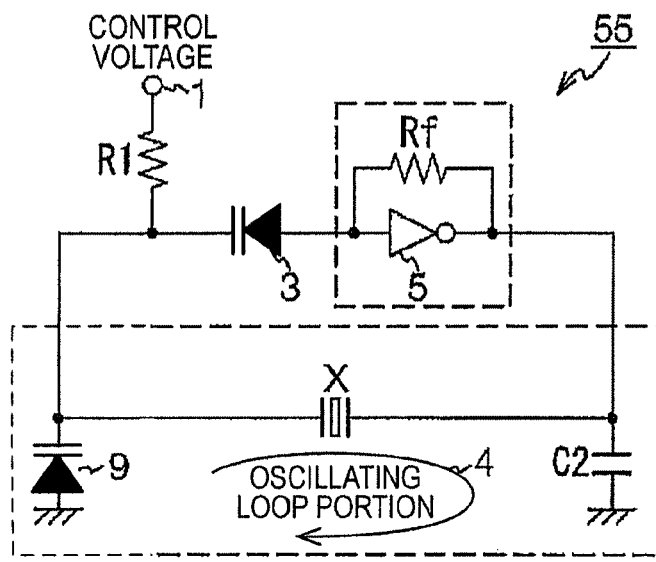
FIG. 6 is a view of circuit configuration of an inverter circuit according to a sixth embodiment of the invention.

FIG. 6 is a view of circuit configuration of an inverter oscillator according to a sixth embodiment of the invention.

In the following description, the components similar to those of the embodiment shown in FIG. 2A and FIG. 2B have the same reference symbols as the embodiment shown in FIG. 2A and FIG. 2B. This oscillator 55 is configured such that at least one of the capacitance elements (C1 in this embodiment of the invention) within the oscillating loop portion 4 according to the embodiment shown in FIG. 3 is used as a varactor 9. Although this embodiment of the invention is described with reference to FIG. 2A and FIG. 2B, it should not be construed restrictively. This embodiment of the invention may be applied to the oscillators according to all the embodiments of the invention.

That is to say, this embodiment of the invention is different from that shown in FIG. 2 in that the capacitance element C1 within the oscillating loop portion 4 is substituted by the varactor 9. As a result, it becomes possible to further widen variable range of oscillating range compared to the case of performing frequency only with the varactor 3. Note that the position of the inserted varactor 9 is effectively substituted by a capacitance element, which is located at the position, to which control voltage is applied.

With such the configuration, control of frequency variable amount can be advantageously performed more easily and miniaturization of the oscillator can be preferably carried out as compared to the configuration, in which the varactor 3 is not used and another varactor other is simply connected to the varactor 9 in parallel through the intermediation of fixed voltage.

Note that in FIG. 1A through FIG. 6, a capacitance element for blocking of direct current may also be inserted between the varactor 3 and the oscillating loop portion (C1 or C2).

In the description above, the case in which an oscillator of an inverter is applied as an oscillating circuit has been explained. However, it should not be construed restrictively. It is also possible to apply the present invention to an oscillator of other configuration such as Colpits type oscillator without departing from the gist of the invention.

Figure 7:
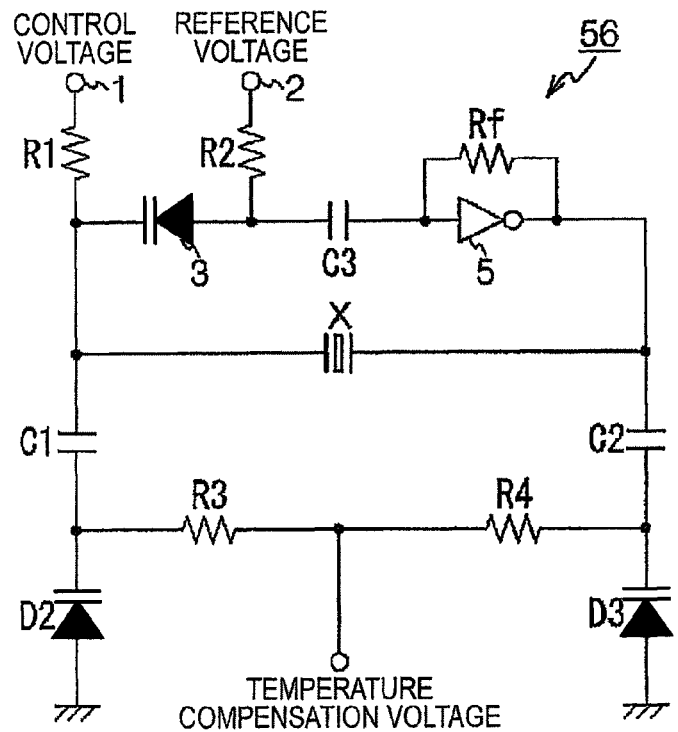
FIG. 7 is a view of circuit configuration of an inverter circuit according to a seventh embodiment of the invention.

FIG. 7 is a view of circuit configuration of an inverter oscillator according to a seventh embodiment of the invention. In the following description, the components similar to those of the embodiment shown in FIG. 1A and FIG. 1B have the same reference symbols as the embodiment shown in FIG. 1A and FIG. 1B. This oscillator 56 is a temperature compensation oscillator constructed such that temperature compensation voltage can be applied to varactors D2, D3.

That is to say, the varactor D2 is connected to a terminal used for applying temperature compensation voltage through the intermediation of a resistance R3 and the varactor D3 is connected to a terminal used for applying temperature compensation voltage through the intermediation of a resistance R4. As temperature compensation voltage, control voltage having control change properties exhibiting direct function with respect to temperature, for example, is used. Further, control voltage having voltage properties exhibiting direct function, for example, is applied also to the varactor 3, thereby making it possible to enhance frequency temperature compensation capacity of the oscillator. As a result, cut angle of a quartz crystal resonator X capable, to which temperature compensation can be performed, can be enlarged.

In other words, according to the above-mentioned oscillating circuit 56, it is possible to perform temperature compensation without any problem even if variation in frequency temperature properties between the respective quartz crystal resonators X is large.

Note that in the case in which negative resistance of the oscillating circuit is high at the time of low temperature and oscillating hardly occur, control voltage capable of changing capacitance value of the varactor 3 may be advantageously applied as the temperature becomes lower. With such the configuration, impedance between the input terminal of the amplifier circuit and the oscillating loop portion at the time of low temperature is controlled to be lower, so oscillating easily occurs.

Note that as a varactor a MOS type varactor can be used. In this case, in order to connect the MOS type varactor instead of the varactor 3, a gate of the MOS type varactor and a resistance R1 may be connected and a back gate of the MOS type varactor and a resistance R2 may be connected.

Figure 8:
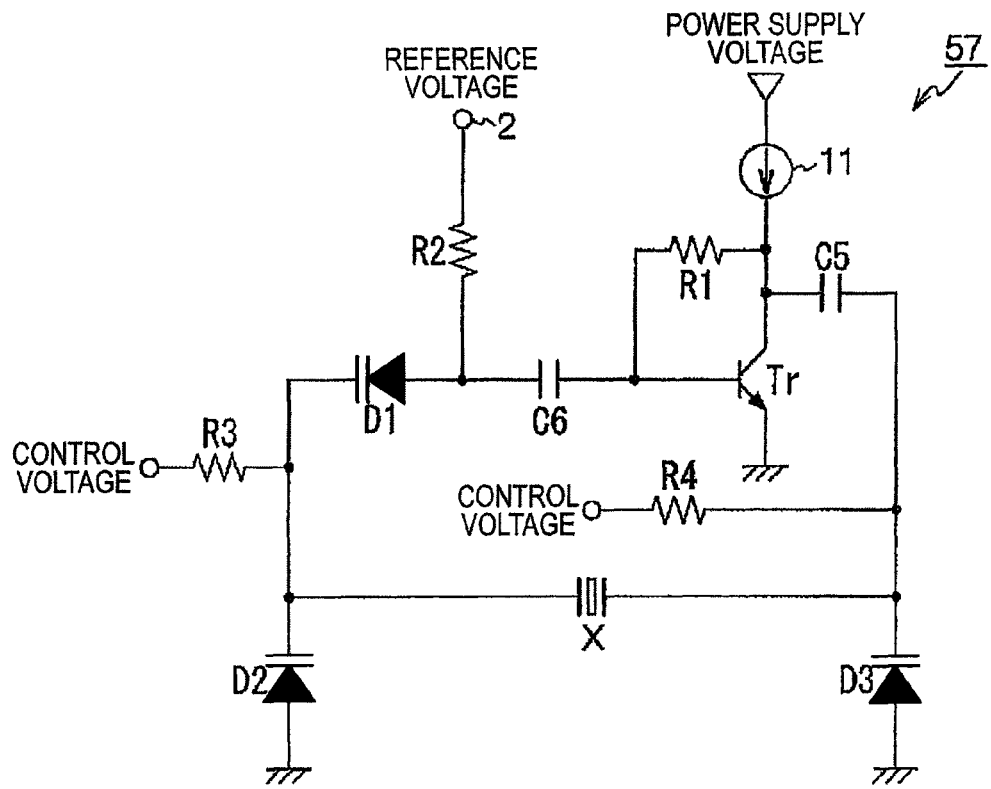
FIG. 8 is a view showing an example of variation of FIG. 7.

That is to say, the oscillator 57 shown in FIG. 8 includes the amplifier circuit having a transistor Tr and an auto-bias resistance R1.

The transistor Tr is constructed such that a collector thereof is connected to a power supply 11 and to one terminal of the capacitance element C5 for blocking of direct current, an emitter thereof is connected to the circuit for grounding, and a base thereof is connected to an anode of the varactor V1 through the intermediation of the capacitance element C6 fore blocking of direct current.

In addition to such the configuration, the oscillator 57 connects a cathode of the varactor D1 to the circuit for grounding through the intermediation of the varactor D2 and the other terminal of the capacitance element C5 to the circuit for grounding through the intermediation of the varactor D3.

Further, a terminal used for applying control voltage is connected to the connection point between the varactor D1 and the varactor D2 through the intermediation of the resistance R3, a terminal used for applying control voltage is connected to the connection point between the varactor 3 and the capacitance element C5 through the intermediation of the resistance R4, the quartz crystal resonator X is respectively connected to the above-mentioned connection points, and the anode of the varactor D1 is connected to the terminal 2 used for inputting reference voltage through the intermediation of the resistance R2.

In the case of such the configuration, in which the transistor is used, noise properties are more enhanced.

As a result, according to the invention, it becomes possible to achieve an oscillator having excellent noise properties by compensating the tendency that the noise properties becomes worse as frequency change amount due to variable capacitance element frequency change amount due to voltage change per unit (frequency sensitivity properties) become larger. Therefore, the present invention is effective in the case of an oscillator having excellent frequency sensitivity properties by using, in particular, a MOS type variable capacitance element.

Figure 9:
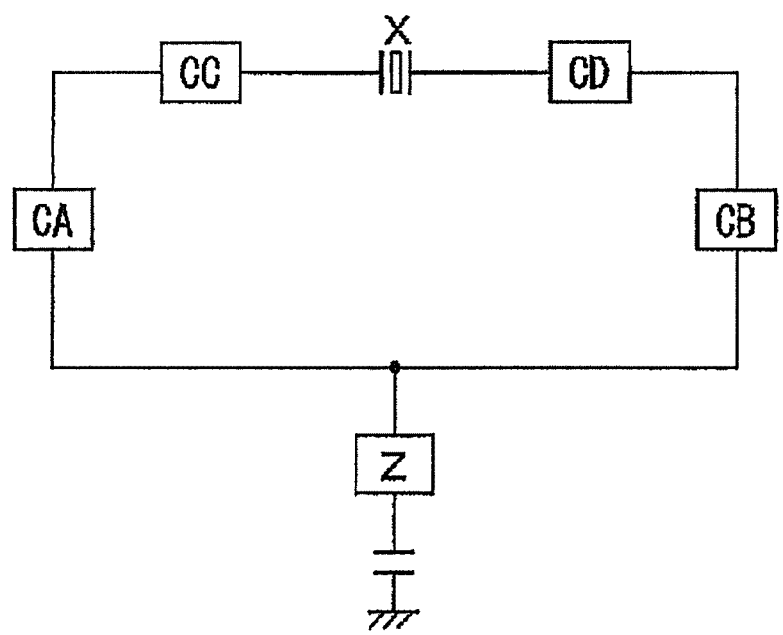
FIG. 9 is a schematic view for illustrating a variation of the oscillating loop portion shown in FIG. 1A through FIG. 5.
Figure 10:
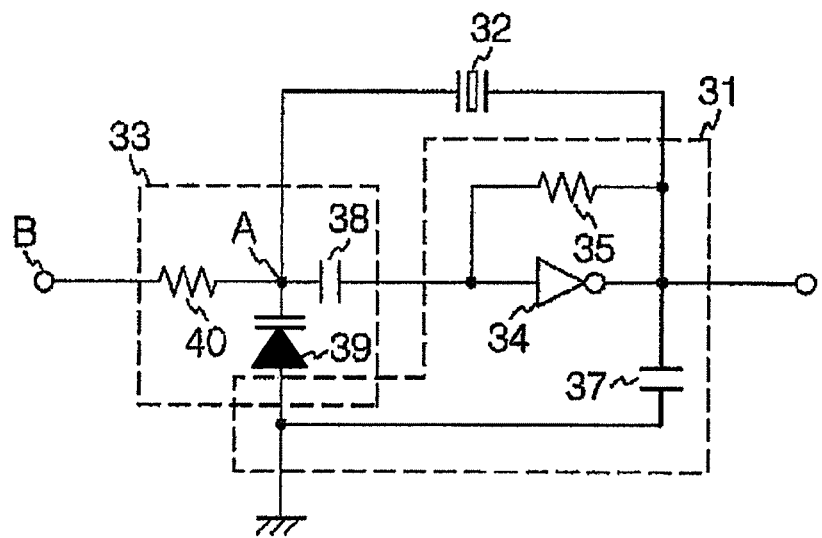
FIG. 10 is a circuit diagram of an inverter circuit of related art disclosed in JP-A-7-273547.

FIG. 9 is a schematic view for illustrating a variation of the oscillating loop portion shown in FIG. 1A through FIG. 5. For example, 1) CC and CD are both configured to be 0Ω, CA and CB are to be capacitance elements having fixed value, and Z is configured to be 0Ω, so that the oscillating loop portion shown in FIG. 1A through FIG. 5 can be achieved.

According to the configuration shown in FIG. 6, CC and CD are both configured to be 0Ω, CA is to be a variable capacitance element, CB is a capacitance element having fixed value, and Z is configured to be 0Ω.

According to the configuration shown in FIG. 7, CC and CD are both to be capacitance elements having fixed value, CA and CB are both to be variable capacitance elements, and Z is configured to be 0Ω.

According to the configuration shown in FIG. 8, CA and CB are both to be variable capacitance elements, CC and CB are configured to be 0Ω, and Z is configured to be 0Ω.

In other words, as to the configuration of the oscillating loop portion, any one of CA, CB, CC and CD may be a variable capacitance element or a capacitance element having fixed value and any combination thereof is possible.

What is claimed is:

1. An oscillator, comprising:
 an amplifier circuit;
 a first variable capacitance element, a control voltage being connected to a first end of the first variable capacitance element and a reference voltage being connected to a second end of the first variable capacitance element between the second end of the first variable capacitance and an input of the amplifier circuit;
 a second variable capacitance element, the control voltage being connected to a first end of the second variable capacitance element and the reference voltage being connected to a second end of the second variable capacitance element between the second end of the second variable capacitance and an output of the amplifier circuit;
 a piezoelectric resonator;
 a capacitance circuit constituting a closed circuit with the piezoelectric resonator; and
 a series circuit, the series circuit including the amplifier circuit, the first variable capacitance element, and the second variable capacitance element connected in series and the series circuit and the closed circuit being connected in parallel.

2. The oscillator according to claim 1, the first variable capacitance element and the second variable capacitance element being voltage-controlled variable capacitance elements.

3. The oscillator according to claim 2, further comprising a resistance connected between the input and the output of the amplifier circuit.

4. The oscillator according to claim 1, the capacitance circuit including a third variable capacitance element.

5. The oscillator according to claim 1, the reference voltage being ground, and the amplifier circuit being an inverter amplifier circuit of a single power supply including an earth terminal.

6. The oscillator according to claim 1, the amplifier circuit being an NPN type transistor, and an emitter of the transistor being connected to ground.

* * * * *